United States Patent [19]

Doehler

[11] Patent Number: 4,664,951
[45] Date of Patent: May 12, 1987

[54] METHOD PROVIDED FOR CORRECTIVE LATERAL DISPLACEMENT OF A LONGITUDINALLY MOVING WEB HELD IN A PLANAR CONFIGURATION

[75] Inventor: Joachim Doehler, Union Lake, Mich.

[73] Assignee: Energy Conversion Devices, Inc., Troy, Mich.

[21] Appl. No.: 760,856

[22] Filed: Jul. 31, 1985

[51] Int. Cl.⁴ .................................................. C23C 16/00
[52] U.S. Cl. .................................. 427/248.1; 118/718; 118/719; 427/255.5
[58] Field of Search ................... 427/39, 74, 85, 248.1, 427/255.5; 118/718, 719

[56] References Cited

U.S. PATENT DOCUMENTS

| | | | |
|---|---|---|---|
| 4,400,409 | 8/1983 | Izu et al. | 427/255.5 |
| 4,410,558 | 10/1983 | Izu et al. | 427/74 |
| 4,438,724 | 3/1984 | Doehler et al. | 118/719 |
| 4,440,107 | 4/1984 | Doehler et al. | 427/255.5 |
| 4,462,332 | 7/1984 | Nath et al. | 118/718 |
| 4,485,125 | 11/1984 | Izu et al. | 427/74 |
| 4,492,181 | 1/1985 | Ovshinsky et al. | 118/718 |
| 4,537,795 | 8/1985 | Nath et al. | 427/255.5 |

Primary Examiner—Sadie L. Childs
Attorney, Agent, or Firm—Marvin S. Siskind; Richard M. Goldman

[57] ABSTRACT

A method of providing for corrective laterally movement of a web of substrate material which is adapted to continuously move in a longitudinal direction through a vapor deposition processor without substantially buckling or tensioning either of the longitudinal edges thereof. The lateral displacement is accomplished without buckling or tensioning the edges of the web despite the fact that the web is magnetically urged into a generally planar path of travel as it moves through the deposition regions of the processor.

12 Claims, 5 Drawing Figures

METHOD PROVIDED FOR CORRECTIVE LATERAL DISPLACEMENT OF A LONGITUDINALLY MOVING WEB HELD IN A PLANAR CONFIGURATION

FIELD OF THE INVENTION

This invention relates generally to apparatus for the continuous vapor deposition of semiconductor alloy material onto a moving web of substrate material and more particularly to apparatus operatively disposed within a vapor deposition processor, said apparatus adapted to substantially eliminate buckling or tensioning of the longitudinal edges of a longitudinally moving web of substrate material as said web is steered for lateral corrective displacement relative to that longitudinal movement.

BACKGROUND OF THE INVENTION

Owing to the increasing scarcity of non-renewable energy reserves such as coal, petroleum and uranium, increased use is being made of alternative nondepletable energy sources, such as photovolatic energy. Single crystal photovoltaic devices, especially crystalline silicon photovoltaic devices, have been utilized for some time as sources of electrical power because they are inherently non-polluting, silent and consume no expendable natural resources in their operation. However, the utility of such devices has been limited by problems associated with the manufacture thereof. More particularly, single crystal semiconductor alloy materials (1) are difficult to produce in sizes substantially larger than several inches in diameter; (2) are thicker and heavier than their thin film counterparts; and (3) are expensive and time consuming to fabricate.

Recently, considerable effort has been expended to develop systems and processes for preparing thin film amorphous semiconductor alloy materials which encompass relatively large areas and which can be deposited so as to form p-type and n-type semiconductor alloy layers for the production therefrom of thin film electronic devices, particularly thin film p-n type and n-i-p type photovoltaic devices which are substantially operatively equivalent or superior to their crystalline counterparts. It should be noted at this point that the term "amorphous" as used herein, is defined to include alloys or materials exhibiting long range disorder, although said alloys or materials may exhibit short or intermediate range order or even contain crystalline inclusions. As used herein the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occurs. It is to be noted that pursuant to the foregoing definitions, the microcrystalline n and p-doped semiconductor alloy materials referred to herein fall within the generic term "amorphous".

Amorphous thin film semiconductor alloys have gained acceptance as the material from which to fabricate electronic devices such as photovoltaic cells, photoresponsive and photoconductive devices, transistors, diodes, integrated circuits, memory arrays and the like. This is because the amorphous thin film semiconductor alloys (1) can be manufactured by relatively low cost continuous processes, (2) possess a wide range of controllable electrical, optical and structural properties and (3) can be deposited to cover relatively large areas. Among the semiconductor alloy materials exhibiting the greatest present commercial significance are amorphous silicon, germanium and silicon-germanium based alloys. Such alloys have been the subject of a continuing development effort on the part of the assignee of the instant invention, said alloys being investigated and utilized as possible candidates from which to fabricate a wide range of semiconductor, electronic and photoresponsive devices.

Additionally, said assignee has developed commercial processing systems for the continuous roll-to-roll manufacture of large area photovoltaic devices. Such continuous processing systems are disclosed in the following U.S. patents, disclosures of which are incorporated herein by reference: U.S. Pat. No. 4,400,409, for A Method Of Making P-Doped Silicon Films And Devices Made Therefrom; U.S. Pat. No. 4,410,588, for Continuous Amorphous Solar Cell Production Systems; and U.S. Pat. No. 4,438,723, for Multiple Chamber Deposition and Isolation System And Method. As disclosed in these patents a web of substrate material may be continuously advanced through a succession of interconnected, environmentally protected deposition chambers, wherein each chamber is dedicated to the deposition of a specific semiconductor alloy material onto the web or onto a previously deposited layer. In making a photovoltaic device, for instance, of n-i-p type configurations, the first chamber is dedicated for the deposition of an n-type semiconductor alloy material, the second chamber is dedicated for the deposition of a substantially intrinsic amorphous semiconductor alloy material, and the third chamber is dedicated for a deposition of a p-type semiconductor alloy material. The layers of semiconductor alloy material thus deposited in the vacuum envelope of the deposition apparatus may be utilized to form photoresponsive devices, such as, but not limited to, photovoltaic devices which include one or more n-i-p type cells. By making multiple passes through the succession of deposition chambers, or by providing an additional array of deposition chambers, multiple stacked cells of various configurations may be obtained. Note, that as used herein the term "n-i-p type" will refer to any sequence of n and p or n, i and p semiconductor alloy layers operatively disposed and successively deposited to form a photoactive region wherein charge carriers are produced by the absorption of photons from incident radiation.

The concept of utilizing multiple stacked cells, to enhance photovoltaic device efficiency, was described at least as early as 1955 by E. D. Jackson in U.S. Pat. No. 2,949,498 issued Aug. 16, 1960. The multiple cell structures therein discussed were limited to the utilization of p-n junctions formed by single crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In tne first cell, a large band gap material absorbs only the short wavelength light, while in subsequent cells, smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. Such tandem cell structures can be economically fabricated in large areas by employing thin film amorphous, semiconductor alloy materials (with or without crystalline inclusions), in accordance with the principles of the instant invention. It should be noted that Jackson employed crystalline semiconductor materials for the fabrication of his stacked cell structure; however, since it is virtually impossible to match lattice constants of differing crystalline materials, it is not possible to fabricate such crystalline tandem cell structures in a commercially feasible manner. In contrast thereto, and as the assignee of the instant invention has shown, such tandem cell structures are not only possible, but can be economically fabricated over large areas by employing the amorphous semiconductor alloy materials and deposition techniques described herein.

In U.S. Pat. No. 4,440,107, filed July 12, 1982, entitled Magnetic Apparatus For Reducing Substrate Warpage, assigned to the Assignee of the instant invention and the disclosure of which is incorporated herein by reference, it was noted that the deposition of successive layers of semiconductor alloy material upon a web of substrate material which was adapted to continuously move through a succession of isolated, but operatively interconnected deposition chambers developed specific problems. In particular, it was noted that in order to deposit semiconductor alloy material from which to fabricate highly efficient photovoltaic devices, it is necessary that each one of the successive layers of semiconductor alloy material (deposited in each respective one of the successive chambers) be of substantially uniform thickness and material properties. However, prior to the disclosure of said U.S. Pat. No. 4,440,107 patent, such continuous deposition apparatus was unable to prevent (1) transverse warping (warping is used synomously to connote buckling or canoeing) of the web of substrate material caused by the force of gravity acting upon the web, the elongated path of travel which the web of substrate material follows, stresses from external sources developed upon the web of substrate material, the high deposition temperatures to which the web of substrate material is continuously subjected, and the forces created by the highly stresssed semiconductor alloy material deposited upon the web of substrate material; or (2) longitudinal warping of the web of substrate material which occurs when the tension on the web of substrate material initiated by the drive and tensioning motors is not precisely adjusted. Obviously, when the web of substrate material warps (either transverse to or longitudinal to the direction of web movement), peaks and valleys are formed upon the deposition surface thereof. It then becomes commonplace to have greater thicknesses of semiconductor alloy material deposited in the valleys while none or lesser thicknesses of the semiconductor alloy material are deposited at the peaks. Such non-uniform deposition of the semiconductor alloy material is undesirable, can create short circuit paths, can create nonuniform electrical, optical and compositional variations in properties of the material, and generally serves to impair the photoconversion efficiency and operation of large area photovoltaic devices fabricated therefrom.

Accordingly, the inventive concept disclosed in said U.S. Pat. No. 4,440,107 patent, i.e., to substantially reduce the transverse and longitudinal warpage of the web of substrate material traveling through the operatively interconnected deposition chambers, was to establish in each of said chambers at least one magnetic force which flattened the web of substrate material by urging said web into a substantially planar configuration as it passed through the deposition region developed therewithin. The flattening of the web of substrate material created by the magnetic field permitted the substantially uniform deposition of successive layers of semiconductor alloy material onto the web of substrate material and, hence, was responsible for an increase in the overall efficiency of large area photovoltaic devices fabricated therefrom.

More specifically, and in order to carry out this stated objective, the web of substrate material was urged upwardly out of its normal path of travel by a plurality of substantially equally spaced rows of ceramic magnets, each magnet extending substantially across the entire transverse width of the web of substrate material. In a preferred embodiment disclosed in that patent, the elongated magnets were spacedly arranged throughout the entire length of the vapor deposition processor, at approximately 8 to 10 inch intervals, so that the web was substantially prevented from warping as layers of semiconductor alloy material were deposited thereupon.

While the concept disclosed in said U.S. Pat. No. 4,440,107 was generally successful in preventing warpage of the web of substrate material passing through such a continuous vapor deposition processor, the addition of another mechanism to the processor, which mechanism was adapted to aid in the take-up of the web of substrate material, i.e., the automatic web steering assembly, was responsible for initiating other types of warpage-related problems, which problems were aggravated if not caused by the magnetic field described hereinabove. More particularly, U.S. Pat. No. 4,485,125, filed Jan. 24, 1983, entitled Method For Continuously Producing Tandem Amorphous Photovoltaic Cells, assigned to the Assignee of the instant invention and the disclosure of which is incorporated herein by reference, describes one type of automatic web steering assembly. The purpose of the automatic web steering assembly was to sense and correct the position of the advancing web of substrate material so as to assure the proper tracking of the web through the multiple deposition chambers of the processor and finally, to assure uniform wind-up of that web onto the take-up core. Generally, the web of substrate material was steered in said U.S. Pat. No. 4,485,125 patent by changing the tension at one edge thereof relative to the opposite edge by means of a specifically designed steering roller.

In operation, the web steering mechanism is located proximate the take-up roller and includes a photosensor assembly which senses the position of one edge of the advancing web of substrate material and generates an electrical signal indicative of that position. The signal is communicated by the photosensor to a motor controller which rotates a servo-motor in either a clockwise or counter-clockwise direction depending upon the position of said one edge of the web relative to a home position maintained on the take-up roller. The rotational motion is communicated to a drive train of the steering mechanism, said mechanism then initiates rotational motion which is adapted to pivot the axis of rotation of the steering roller. The rotational motion changes the tension on one of the longitudinal edges of the web, thus steering the web and eliminating "telescoping" as the web is wound about the take-up core.

Figure 3:
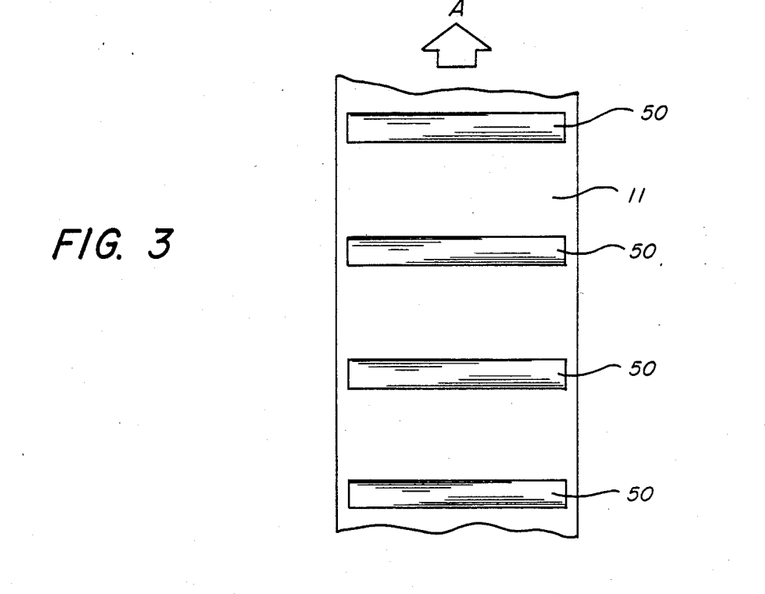
FIG. 3 is a fragmentary, top plan view of a web of substrate material moving through a vapor deposition processor, such as the processor depicted in FIG. 2, illustrating a generally planar, non-tensioned path of travel of that web.
Figure 4:
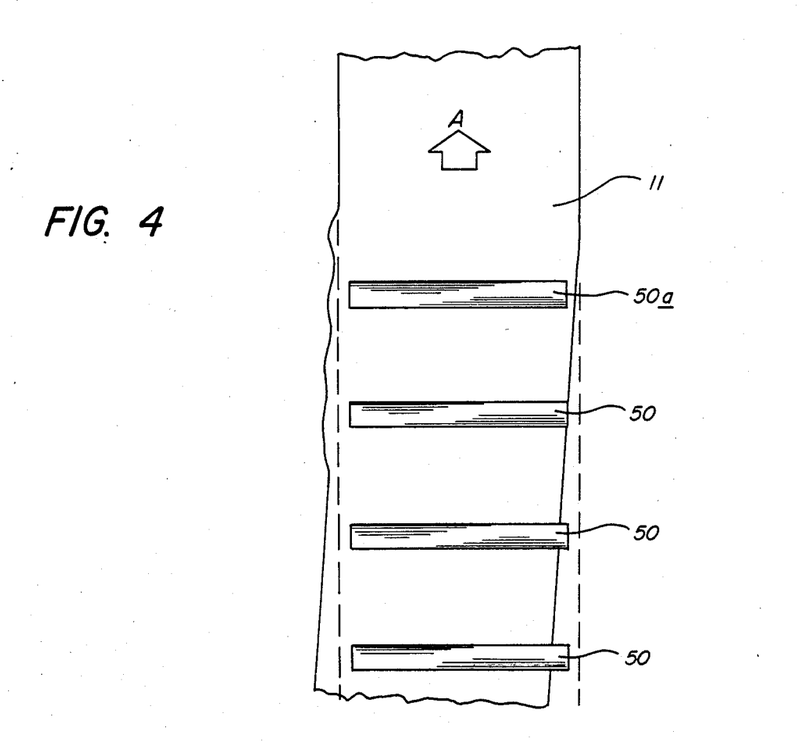
FIG. 4 is a fragmentary, top plan view of the web of substrate material of FIG. 3 moving through the processor of FIG. 2, illustrating the tension and compression forces acting on opposed longitudinal edges of the web.

Referring now to FIGS. 3 and 4, the manner in which the magnetic field established by the uniformly spaced, elongated magnets responds to a steering action by the web steering mechanism in order to place one longitudinal edge of the web of substrate material in tension and the opposite longitudinal edge of the web of substrate material in compression, thereby buckling that edge of the web which is held in compression, will now be described.

FIG. 3 illustrates a web of substrate material 11 assuming a normal path of travel through the longitudinal extent of the vapor deposition processor. The web of substrate material 11 is adapted to be held in a generally planar configuration for the deposition of a semiconductor alloy material thereonto by a plurality of spaced, elongated, transversely extending ceramic magnets 50 so as to prevent buckling of that web during the deposition process. In FIG. 3, the web of substrate material 11 is depicted as assuming a substantially perfect alignment in which (1) the lateral edges of the web of substrate material 11 are perfectly aligned and (2) the planar surface of the web of substrate material is held in a single plane throughout the path of travel of that web through the processor.

In contrast thereto and with particular reference to FIG. 4, the longitudinal edges of the web of substrate material 11 have been found to assume a generally non-aligned attitude and the deposition surface of the web of substrate material has been found to assume a non-planar attitude as the web moves through the length of the vapor deposition processor. The phantom lines present in FIG. 4 depict a perfect alignment of the longitudinal edges of the web while the solid lines indicate the true condition which is seen as the web of substrate material 11 moves through said processor. This condition has been seen when the processor is opened up after a deposition run in which non-uniform semiconductor alloy material was deposited upon the deposition surface of the web of substrate material 11. It has therefore been noted that buckling of the web of substrate material 11 along one lateral edge thereof can be directly observed. As this phenomena is traced throughout the path of travel of the web through the processor, the web appears to have been locally displaced by as much as one-quarter of an inch at one edge thereof so that the opposite lateral edge begins to buckle. This phenomena of buckling was not prevalent until heavy magnetic rollers were added to the processor.

One plausible explanation for the hereinabove described buckling problem is that the steering mechanism places one lateral edge of the web of substrate material in tension in order to shift the position of that web relative to its home position on the take-up roller. Absent the presence of the large magnetic field which tends to maintain the position of the web constant despite the input of the externally acting steering forces, the web of substrate material would quickly realign itself in the position indicated in FIG. 3. However, because the strong magnetic field is present, the web is unable to move laterally (or "walk"). This anti-steering component of the magnetic field tends to angulate the web and amplifies the tensile force sensed by the opposite longitudinal edge thereof. More particularly, when the web of substrate material encounters the first of the elongated magnets 50a, it angulates due to the resistive forces of that magnet and the magnets immediately upstream thereof. The result is a buckling of that edge of the web of substrate material 11 which is subject to the compressive forces. It is to the end of providing for the corrective lateral displacement of a longitudinally moving web held in a planar configuration to which the inventive concept presented by the instant application is directed.

These and other objects and advantages of the present invention will become apparent from the detailed description, the drawings and the claims which follow.

BRIEF SUMMARY OF THE INVENTION

There is disclosed herein a processor, which processor includes a deposition region wherein material is vapor deposited onto a continuously moving web. The processor further includes means urging the web into a generally planar path of travel as it passes through said deposition region. Means are also provided which are operatively associated with the web urging means and which are adapted to provide for the corrective lateral movement of the web relative to the longitudinal direction of travel thereof. In this manner, the web may be laterally displaced without substantially buckling or tensioning either of the longitudinal edges thereof. In the preferred embodiment, the web is an elongated web of magnetically attractive substrate material and a magnetic field is employed to urge the web into the said generally planar path of travel. The magnetic field is established by at least one elongated, cylindrically-shaped roller magnet which is operatively disposed in rolling engagement with and which extends across the entire transverse extent of the non-deposition surface of the web. The elongated magnet is further mounted for pivotable movement relative to the longitudinal direction of travel of the web of substrate material by pivotably attaching each of the distal ends of the magnet to a linkage. One end of the linkage is then pivotably connected to a fixed bearing and the other end of the linkage is pivotably connected to a movable bearing. In a preferred embodiment, at least two elongated magnets are included, the deposition region is transversely bounded by opposed cathode shields which extend upwardly and inwardly. At least one of the magnets is sized and disposed for rotatable and pivotable reception in the space formed between the inwardly expanding flanges of the opposed cathode shields. The web of substrate material is preferably disposed to move below the inwardly extending flanges of the opposed cathode shields and the linkages are affixed to the cathode shields so that the magnets are adapted for lateral displacement a distance equal to the distance that the web may be displaced. At least one of the magnets is laterally lengthened a distance greater than the space formed between the inwardly extending flanges of the opposed cathode shields, said laterally lengthened magnet being operatively disposed across the leading edge of the space so as to guide the web of substrate material beneath the inwardly extending flanges of those cathode shields.

There is also disclosed herein a method adapted to provide for corrective lateral movement of the continuously and longitudinally moving web without substantially buckling or tensioning of either of the longitudinal edges thereof. The web is operatively disposed within a processor adapted for the vapor deposition of material in a deposition region thereof. The processor includes means urging the web into a generally planar path of travel through said deposition region. The method includes the step of providing means operatively associated with the web urging means, which operatively associated means are adapted to provide for corrective lateral movement of the web relative to the longitudinal direction of travel thereof without buckling or tensioning said web.

DETAILED DESCRIPTION OF THE DRAWINGS

I. The Photovoltaic Cell

Figure 1:
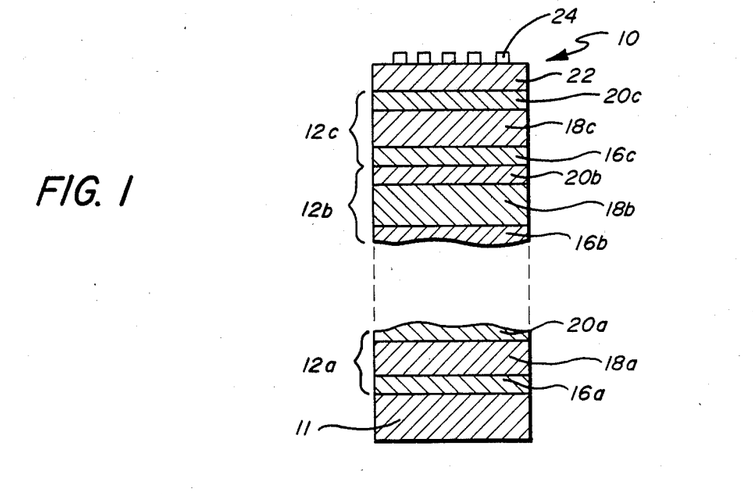
FIG. 1 is a fragmentary, cross-sectional view of a tandem photovoltaic device comprising a plurality of n-i-p type cells, each layer of the cells formed from a semiconductor alloy material.

Referring now to the remainder of the drawings and particularly to FIG. 1, a photovoltaic cell, formed of a plurality of successive n-i-p layers, each layer of which includes, in the preferred embodiment, a substantially amorphous semiconductor alloy, is shown generally by the reference numeral 10. It is for the production of this type of photovoltaic device, wherein uniform, homogeneous, substantially amorphous semiconductor alloy layers are continuously deposited onto a substrate in successive isolated deposition chambers, that the plasma confinement apparatus of the present invention was developed. It is to be noted that the term "substantially amorphous", as used herein, is intended to refer to semiconductor alloy material which does not exhibit long range order and that term may include amorphous semiconductor alloy material having microcrystalline inclusions.

More particularly, FIG. 1 shows a n-i-p-type photovoltaic device, such as a solar cell, fabricated from a plurality of stacked, individual p-i-n-type cells, such as cells 12a, 12b and 12c. Below the lowermost cell 12a is a substrate 11 which may be transparent such as glass or plastic, or formed from a metallic material such as stainless steel, aluminum, tantalum, molybdenum or chrome. Although certain applications may require a thin oxide layer and/or a series of base contacts prior to the application of the substantially amorphous semiconductor alloy material, for purposes of this application, the term "substrate" shall include not only a flexible film, but also any elements added thereto by preliminary processing.

Each of the cells 12a, 12b and 12c are fabricated with a substantially amorphous semiconductor alloy body containing at least a silicon alloy. Each of the semiconductor alloy bodies includes an p-type conductivity region or layer 20a, 20b and 20c; an intrinsic region or layer 18a, 18b and 18c; and a n-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although n-i-p cells are illustrated, the plasma confinement apparatus of this invention may also be used with apparatus adapted to produce single or multiple p-i-n cells.

It is to be understood that following the deposition of the layers of semiconductor alloy material, a further deposition process may be either performed in a separate environment or as a part of the continuous process. In this step, a TCO (transparent conductive oxide) layer 22, such as indium tin oxide, is deposited atop the exposed layer of semiconductor alloy material of the uppermost cell. Further, an electrode grid 24 may be added to the device where the cell is of sufficiently large surface area, or if the electrical conductivity of the TCO layer 22 is insufficient. The grid 24 shortens the carrier path and increases the photovoltaic conduction efficiency of the photovoltaic device 10.

II. The Multiple Glow Discharge Deposition Chambers

Figure 2:
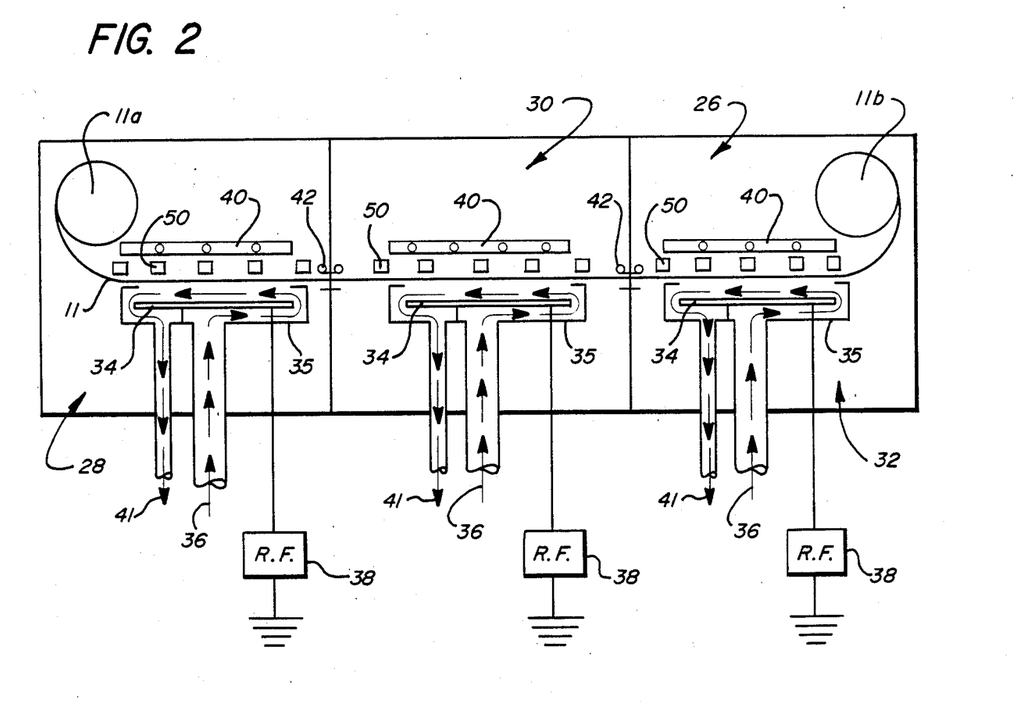
FIG. 2 is a diagrammatic representation of a multiple glow discharge chamber deposition processor adapted for use in the continuous production of photovoltaic devices such as the tandem photovoltaic devices shown in FIG. 1.

Turning now to FIG. 2, a diagrammatic representation of multiple glow discharge chamber deposition apparatus for the continuous production of semiconductor devices is generally illustrated by the reference numeral 26. The apparatus 26 includes a plurality of isolated, dedicated, glow discharge deposition chambers, each chamber of which is interconnected by a gas gate 42 through which (1) sweep gases, and (2) a web of substrate material 11 are adapted to pass.

The deposition apparatus 26 is adapted to continuously deposit successive n-i-p layers of substantially amorphous semiconductor alloy material onto the large area surface of the web of substrate material 11 which is continually fed therethrough. To deposit the layers of semiconductor alloy material required for producing multiple n-i-p type photovoltaic cells, the apparatus 26 includes at least one triad of deposition chambers. Each of the at least one triad of deposition chambers comprises: a first deposition chamber 28 in which a layer of n-type conductivity semiconductor alloy material is deposited onto the deposition surface of the web of substrate material 11 as the web passes therethrough; a second deposition chamber 30 in which a layer of intrinsic semiconductor alloy material is deposited atop the n-type layer on the deposition surface of the web of substrate material 11 as the web 11 passes therethrough; and a third deposition chamber 32 in which a layer of p-type semiconductor alloy material is deposited atop the intrinsic layer on the deposition surface of the web of substrate material 11 as the web 11 passes therethrough.

It should be apparent that (1) although, only one triad of deposition chambers has been illustrated, additional triads or additional individual chambers may be added to the apparatus to provide the machine with the capability of producing semiconductor devices having any number of n-i-p type layers of semiconductor alloy material; (2) the substrate supply core 11a and the substrate take-up core 11b are shown in the deposition chambers for illustrative purposes only, while in reality the cores would be housed in separate chambers operatively connected to the deposition chambers; (3) although the glow discharge illustrated herein employs cathodes with r.f. power, other energy supplies, such as a.c. power generators, microwave generators and d.c. power generators, may be employed without departing from the spirit or scope of the present invention; and (4) the gaseous precursor sources of semiconductor alloy material may either be introduced to flow in a direction parallel but opposite to the direction of movement of the substate through the deposition chambers, or to be introduced into the plasma regions of the deposition chambers through the cathode plates themselves.

Each deposition chamber, 28, 30 and 32 of the triad is adapted to deposit a single layer of semiconductor alloy material, by glow discharge deposition, onto the electrically conductive web of substrate material 11. To that end, each of the deposition chambers 28, 30 and 32 includes: a cathode plate 34; a gas confinement shield (a cathode shield) 35 disposed about each of the cathodes 34; a process gas supply conduit 36; a radio frequency generator or other a.c. or d.c. power source 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each of the adjacent dopant deposition chambers. A flow of isolation gas is preferably provided in the gas gate passageways for maintaining the gaseous environment of the intrinsic deposition chamber 30 free of gaseous contaminants from the interior atmospheres of the discrete dopant deposition chambers 28 and 32.

The supply conduits 36 are operatively associated with the respective cathode plates 34 or other decomposition mechanisms to deliver process gas mixtures to the plasma regions created in each deposition chamber between said decomposition mechanism and the web of substrate material 11. The cathode shields 35 are adapted to operate in conjunction with the web of substrate material 11 and the evacuation conduit 41 to substantially confine the mixture of process gases within the cathode region of the deposition chambers.

The radio frequency or other similar type of power generators 38 operate in conjunction with the cathode plates 34, the radiant heaters 40 and the grounded web of substrate material 11 to form the plasma by disassociating and recombining the elemental reaction gases entering the deposition chambers into highly reactive deposition species and compounds. These activated species and compounds are then deposited onto the bottom surface of the web of substrate material 11 as uniform and homogeneous layers of semiconductor alloy material. The web of substrate material 11 is maintained substantially flat by the plurality of rows of magnetic elements 50 which provide an attractive force urging the web of substrate material 11 upwardly, out of its normal sagging path of travel.

To form the type of photovoltaic device 10 illustrated in FIG. 1, a layer of n-type, substantially amorphous (and preferably microcrystalline) semiconductor alloy material is deposited onto the web of substrate material 11 in the n-dopant deposition chamber 28, a layer of intrinsic substantially amorphous semiconductor alloy material is deposited atop the p-type layer in the intrinsic deposition chamber 30 and a layer of p-type substantially amorphous (and preferably microcrystalline) semiconductor alloy material is deposited atop the intrinsic layer in the p-dopant deposition chamber 32. As a result, in the preferred embodiment, the apparatus 26 is adapted to successively deposit at least three substantially amorphous layers of semiconductor alloy material onto the web of substrate material 11 with the intrinsic layer deposited in deposition chamber 30 differing in composition from the layers deposited in deposition chambers 28 and 32 by the absence of at least one element which will be referred to hereinafter as the dopant or doping species.

It is important that each of the layers of semiconductor alloy material be uniformly and homogeneously deposited across the entire large area surface of the web of substrate material 11. Therefore, each layer of the deposited semiconductor alloy material must be deposited from specific activated species and compounds of the mixture of precursor process gases which have been subjected to a uniform electromagnetic field for substantially identical lengths of time. Only in this manner, is it possible for layers of semiconductor alloy material which possess uniform compositional and bonding characteristics and which exhibit a uniform, homogeneous range of optical, electrical, and chemical properties across the entire surface of the web of substrate material 11 to be deposited. It is to the end of satisfying the above criteria of uniformity and homogeneity that the prevention of longitudinal buckling of the instant invention is directed.

Figure 5:
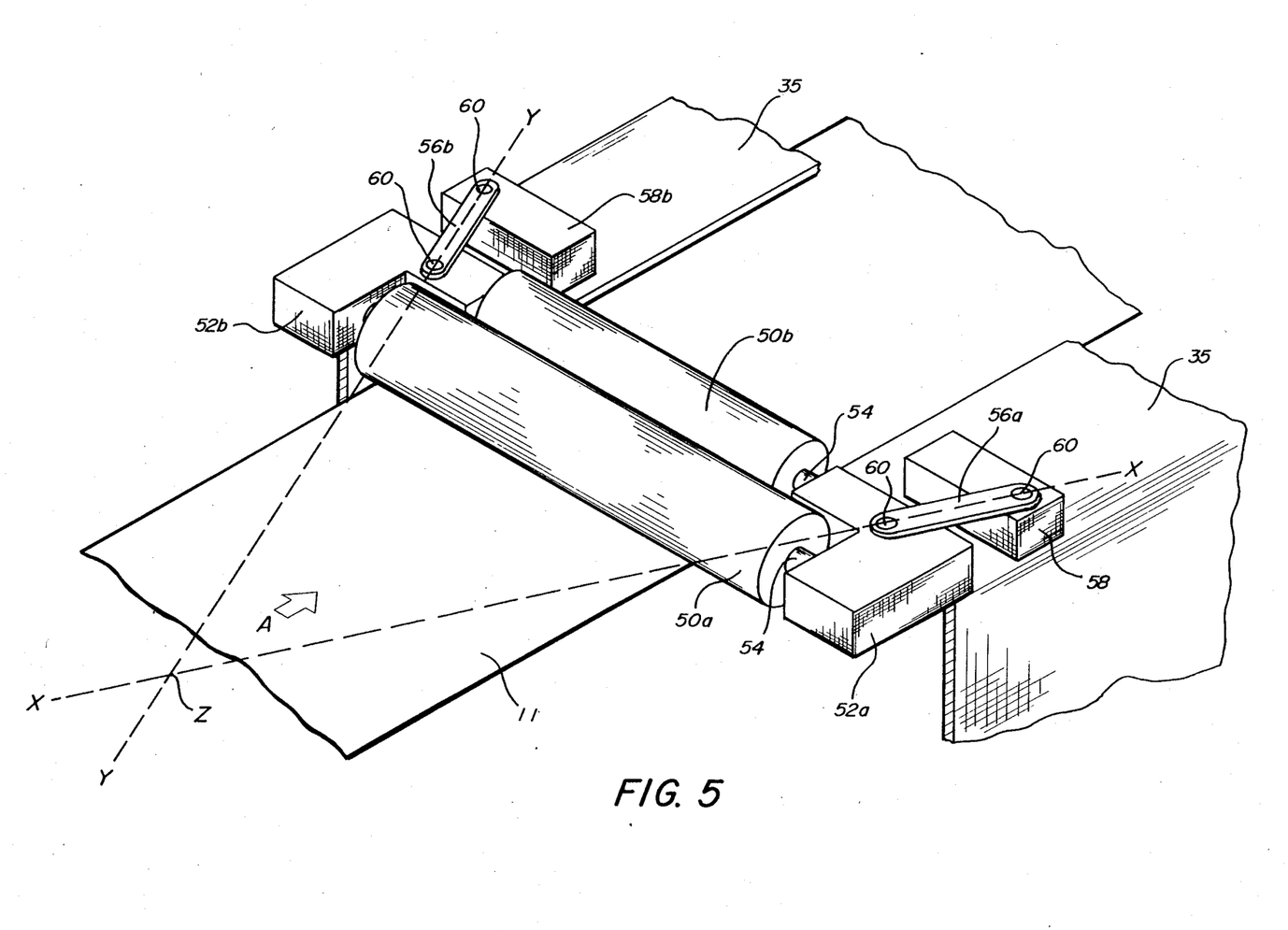
FIG. 5 is a fragmentary, perspective view of the apparatus adapted to provide for corrective lateral displacement of the longitudinally moving web of substrate material of the instant invention, said apparatus operatively disposed relative to the opposed, transversely spaced cathode shields of the processor.

Referring now to FIG. 5, there is illustrated one particular embodiment of the web urging means of the instant invention adapted to provide for the corrective lateral motion of a web relative to the longitudinal direction of travel thereof. The embodiment illustrated may be readily adapted for use in a continuous deposition system generally similar to the system 26 illustrated with reference to FIG. 2; accordingly, similar features will be referred to by similar reference numerals.

As illustrated in FIG. 5, a web of substrate material 11, generally formed of a magnetically attractable material such as stainless steel is guided and supported by two rollers 50a, 50b as it travels into the plasma region of a deposition apparatus, said plasma region defined by a cathode shield 35, the upper flanges of which are visible in the drawing. The two rollers 50a, 50b are formed of a magnetic material, such as a ceramic magnetic material and engage the substrate 11 in rolling contact so as to guide it in a generally planar path of travel.

Two rollers, 50a, 50b, are provided to better support and guide the web 11 as it passes beneath the upper flanges of the cathode shield 35. While it has been found that one roller will support and guide the web 11, the inclusion of a second roller serves to better direct the web 11 as it passes beneath the flanges of the shield 35, thereby preventing unwanted contact which could result in scratching. The first roller 50a is disposed just before the edge of the cathode shield 35 and, accordingly, may be of a greater length than the width of the substrate 11 so as to better support and guide it. The second roller 50b is disposed between the two flanges of the cathode shield 35 and, accordingly, is slightly smaller than the width of the substrate 11. The two rollers 50a, 50b cooperate to smoothly guide the web of substrate material 11 beneath the flanges. While the two rollers 50a, 50b have both been described as being magnetic rollers, it is possible to practice the invention with only one magnetic roller, the second roller serving merely to guide the web 11. In such an embodiment, it is generally preferred that the larger roller 50a be the magnetic roller.

The two rollers 50a, 50b are rotatably mounted into a pair of roller support blocks 52a, 52b. The axles 54 of the rollers 50a, 50b fit into recesses (not visible) in the support blocks 52a, 52b which recesses may be provided with bearings such as roller bearings, ball bearings or journal bearings, to support the axles 54 and insure ease of rotation thereof. Each of the roller support blocks 52a, 52b is pivotably connected to a stationary support block 58a, 58b by a pivotable link 56a, 56b attached thereto with a rotatable connector such as a hinge pin 60 which provides for ready pivoting of the links 56a, 56b. It is the function of the pivotable links 56a, 56b to provide for the vertical support of the roller blocks 52a, 52b and the rollers attached thereto 50a, 50b while permitting the lateral translation motion thereof.

It will be noted from the figure that the two pivotable links 56a, 56b were disposed in an angulated (i.e., nonparallel) relationship with the edge of the web of substrate 11. As shown in the figure, the links 56a, 56b are disposed such that imaginary lines x—x extending through the hinge pins 60 of links 56a and y—y extending through the hinge pins 60 of link 56b meet at a point z upstream of the rollers 50a, 50b. Although such an arrangement is not essential to the instant invention, it is often desirable to dispose the pivotable links 56a, 56b in such a manner because the rollers 50a, 50b then become "self-centering" with respect to the width of the web of substrate material 11.

In operation, the roller assembly of the instant invention, as depicted in FIG. 5, magnetically attracts and rollably engages the substrate 11 passing therebeneath. The rollers provide vertical support to the substrate, thus tending to maintain it in a generally planar configuration, while guiding that substrate 11 into the cathode region. Since the roller assembly is free to move in a lateral direction, corrective forces applied to the web by means such as a steering assembly disposed up or downstream thereof, cause both the web and roller assembly to move in a lateral direction without causing buckling or undue tensioning of the edges of the web 11. In addition to causing non-uniform deposition, as discussed hereinabove, buckling and tensioning can cause the edges of the web 11 to scrape against the flanges of the cathode shield 35, scratching the deposited layers; or, to pull away from the cathode shield 35, thereby allowing escape of process gases from the deposition region, thereby resulting in lack of control of the deposition process and the possible introduction of contaminants. Web buckling also causes similar problems when it occurs in the gas gates 42 in FIG. 2. Web buckling in the gas gate can result in scratching of the deposited films or the formation of flow channels which enable the interdiffusion of different process gases between various chambers of the system.

It should also be noted that while FIG. 5 depicts a single assemblage of rollers, a large scale, continuous process, roll-to-roll deposition system would generally include a plurality of such assemblies.

Clearly, many modifications may be made to the embodiment illustrated in keeping with the principles of the instant invention. For example, a pivotably mounted single roller may be employed to urge the substrate into a planar path of travel. Likewise, a plurality of individually, pivotably mounted rollers may be employed. In other embodiments, it may be desirable to utilize a web urging assembly comprised of more than two rollers connected to a single support block. In still other embodiments, it may be desirable to utilize magnetic support elements which maintain sliding, rather than rolling, contact with the substrate.

While the foregoing description and discussion has generally involved the roll-to-roll production of semiconductor devices, the inventive principles disclosed herein may obviously be employed in any situation where elongated material is being handled. Furthermore, while the discussion herein primarily concerns magnetic attraction of the web, other attractive forces such as electrostatic, vacuum or even adhesive, forces may similarly be employed.

The foregoing descriptions and discussions are merely meant to be illustrative of the practice of the instant invention. It is the following claims, including all equivalents, which define the instant invention.

What is claimed is:

1. A method adapted to provide for corrective lateral movement of a continuously and longitudinally moving web without buckling or tensioning either of the longitudinal edges thereof; said web being operatively disposed within a processor wherein material is vapor deposited thereonto in a deposition region thereof; the method including the steps of:
   providing means for urging the web into a substantially planar path of travel;
   movably mounting said web urging means for lateral displacement, whereby corrective lateral movement of the web relative to said longitudinal direction of travel may be achieved without buckling or tensioning the longitudinal edges thereof.

2. A method as in claim 1, including the further step of providing an elongated web of magnetically attractable substrate material and employing a magnetic field to urge the web into the generally planar path of travel.

3. A method as in claim 2, including the further step of establishing the magnetic field by at least one ceramic magnet.

4. A method as in claim 3, including the further step of extending the at least one ceramic magnet approximately across the transverse extent of the web.

5. A method as in claim 4, including the further step of mounting the ceramic magnet for rotational engagement with the web to prevent scratching the non-deposition surface of the web.

6. A method as in claim 2, including the further steps of establishing the magnetic field through the use of at least one elongated, cylindrically-shaped roller magnet; and operatively disposing said cylindrically-shaped magnet in rolling engagement with the non-deposition surface of the web.

7. A method as in claim 5, including the further step of mounting the magnet for pivotable movement relative to the longitudinal direction of travel of the web of substrate material.

8. A method as in claim 7, wherein the step of mounting the magnet for pivotable movement comprises mounting the magnet for pivotable movement about a point on the web of substrate material upstream of said magnet.

9. A method as in claim 7, including the further steps of: pivotably attaching each of the distal ends of the magnet to a linkage; pivotably connecting one end of the linkage to a fixed bearing and the other end of the linkage to a movable bearing.

10. A method as in claim 9, including the further steps of: providing at least two magnets; transversely bounding the deposition region by opposed cathode shields which extend upwardly and inwardly; sizing and disposing at least one of the magnets for rotatable and pivotable reception in the space formed between the inwardly extending flanges of the opposed cathode shields.

11. A method as in claim 10, including the steps of operatively disposing the web of substrate material for movement below the inwardly extending flanges of the opposed cathode shields; and fixing the linkages to the cathode shields, whereby the magnets are adapted to be laterally displaced a distance equal to the distance that the web may be displaced.

12. A method as in claim 10, including the further steps of: laterally lengthening at least one of the magnets a distance greater than the space formed between the inwardly extending flanges of the opposed cathode shields; and operatively disposing the laterally lengthened magnet across the leading edge of said space so as to guide the web of substrate material beneath the inwardly extending flanges of the cathode shields.

* * * * *